(12) United States Patent
Lim

(10) Patent No.: US 7,381,584 B2
(45) Date of Patent: Jun. 3, 2008

(54) CMOS IMAGE SENSOR AND A METHOD FOR FABRICATING THE SAME

(75) Inventor: Keun Hyuk Lim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 279 days.

(21) Appl. No.: 11/217,575

(22) Filed: Aug. 31, 2005

(65) Prior Publication Data

US 2006/0060898 A1 Mar. 23, 2006

(51) Int. Cl.
*H01L 31/0216* (2006.01)
(52) U.S. Cl. .................. 438/69; 438/520; 257/E31.121
(58) Field of Classification Search .................. 438/59, 438/69, 71, 72, 520; 257/E31.04, E31.12, 257/E31.121
See application file for complete search history.

(56) References Cited

U.S. PATENT DOCUMENTS

| 5,671,914 | A | 9/1997 | Kalkhoran et al. | |
|---|---|---|---|---|
| 6,211,560 | B1* | 4/2001 | Jimenez et al. | 257/451 |
| 6,828,234 | B2* | 12/2004 | Tam et al. | 438/663 |
| 2004/0075153 | A1* | 4/2004 | Fujisawa | 257/437 |
| 2004/0147068 | A1* | 7/2004 | Toyoda et al. | 438/197 |
| 2004/0217436 | A1* | 11/2004 | Kimura | 257/461 |
| 2005/0151218 | A1* | 7/2005 | Mouli | 257/446 |

FOREIGN PATENT DOCUMENTS

| EP | 0 106 540 A2 | | 4/1984 |
|---|---|---|---|
| JP | 62190872 A | * | 8/1987 |

OTHER PUBLICATIONS

German Office Action; German Pat. Appl. No. 10 2005 044 902.6-33; The German Patent and Trademark Office, Germany; Jan. 23, 2007; 3 Pages.

* cited by examiner

*Primary Examiner*—Carl Whitehead, Jr.
*Assistant Examiner*—Jennifer M Dolan
(74) *Attorney, Agent, or Firm*—Andrew D. Fortney

(57) ABSTRACT

A CMOS image sensor and method for fabricating the same is disclosed that reconditions, repairs and/or protects a surface of a photodiode area and improves characteristics of the image sensor. The method includes forming a photodiode area and a plurality of transistors, implanting a predetermined ion into a surface of the photodiode area, and forming a surface oxide film on the surface of the photodiode area by oxidation. Therefore, it is possible to recover or repair the photodiode surface damaged during various fabrication processes, reduce or minimize surface leakage of the photodiode during subsequent processes, and improve image sensor characteristics by increasing incident light on the photodiode.

21 Claims, 5 Drawing Sheets

CMOS IMAGE SENSOR AND A METHOD FOR FABRICATING THE SAME

This application claims the benefit of Korean Patent Application No. P2004-75443, filed on Sep. 21, 2004, which is hereby incorporated by reference in its entirety as if fully set forth herein.

BACKGROUND OF THE INVENTION

1. Field of the Invention

The present invention relates to a complementary metal-oxide semiconductor (CMOS) image sensor, and more particularly, a method for fabricating a CMOS image sensor that reconditions and/or protects a surface of a photodiode and improves characteristics of the image sensor.

2. Discussion of the Related Art

Generally, a CMOS image sensor is a device that converts optical images, i.e., incident light, to electrical output signals using an array of pixels, each unit pixel comprising a P-N junction photodiode and accompanying CMOS transistor circuitry.

In view of the large number of pixel units per array, CMOS-image sensors employ a switching mode that sequentially detects electrical output signals for each unit pixel using MOS transistors in a number directly proportional to the number of pixels. An important consideration in a CMOS image sensor is to have high sensitivity to incident light.

CMOS image sensors have several advantages over charge coupled device (CCD) image sensors, which are widely used, such as a simple driving mode, various scanning modes, miniaturization of the product because of or through signal processing circuit integration in a single chip, low fabricating cost owing to compatible CMOS techniques, and low operating power consumption.

CMOS image sensors are classified by the number of transistors utilized in each pixel, including a three-transistor (3T) type, a four-transistor (4T) type, and a five-transistor (5T) type. The 3T type CMOS image sensor includes a photodiode and three transistors. The 4T type CMOS image sensor includes a photodiode and four transistors. The 5T type CMOS image sensor includes a photodiode and five transistors. An equivalent circuit and a layout of a unit pixel of the 4T type CMOS image sensor will be described with reference to FIGS. 1-2.

FIG. 1 is a circuit diagram illustrating a related art 4T type CMOS image sensor. FIGS. 2A-2C are cross-sectional views illustrating part of the fabrication process of the related art CMOS image sensor.

A general related art 4T type CMOS image sensor, as shown in FIG. 1, includes a unit pixel consisting of a photodiode and four MOS transistors. The CMOS image sensor includes a photodiode 100 generating electrical charges responsive to incident light, a transfer transistor 101 transferring the charges collected in the photodiode 100 to a floating diffusion area 102 in response to signal Tx, a reset transistor 103 setting the potential of the floating diffusion area 102 at a desired value and emitting charges to reset the floating diffusion area 102 in response to signal Rx, a drive transistor 104 serving as a source follower buffer amplifier, and a select transistor 105 addressing a switching mode in response to signal Sx. A load transistor 106 is formed outside the unit pixel to read output signals (or set the potential of the output node at a desired value, such as a ground potential) in response to signal $R_L$.

A related art method for fabricating a CMOS image sensor will now be described with reference to the accompanying drawings.

FIGS. 2A to 2C are sectional views illustrating a related art process of fabricating a CMOS image sensor containing four transistors and a photodiode. The related art CMOS image sensor fabrication illustrations focus on the photodiode area and a transfer transistor adjacent to the photodiode area.

First, as shown in FIG. 2A, a gate electrode 12 is formed on a semiconductor substrate 11, generally with a gate oxide film therebetween. A barrier oxide film 13 is formed on substrate 11 to minimize surface leakage of the semiconductor substrate 11 during various ion implantation processes performed on the substrate 11.

Afterwards, although not shown, a photoresist pattern may be formed to expose portions of the semiconductor substrate 11 to ion implantation to form a lightly doped drain (LDD) area and N type source/drain (NSD) areas. The LDD area and the NSD areas are formed using the photoresist pattern as an ion implantation mask.

Next, as shown in FIG. 2B, a photoresist pattern PR is formed, leaving exposed a portion of the semiconductor substrate 11 having barrier oxide film 13 thereon. Photodiode area PD 14 is formed in the exposed portion of the semiconductor substrate 11 using the pattern PR as an ion implantation mask.

As shown in FIG. 2B, the photodiode area 14 is formed at an edge of the gate electrode 12 of the transfer transistor Tx in such a way that one side of each is aligned with the other. Thereafter, pattern PR is removed.

Subsequently, as shown in FIG. 2C, a spacer 12a is formed at (both) sidewalls of the gate electrode 12 by depositing an insulating film for the spacer and anisotropically etching the entire insulating film. The barrier oxide film 13 is then removed by a wet etching process.

Several identifiable problems exist with the related art fabrication process for CMOS image sensors. As discussed, after the gate electrode 12 and the barrier oxide film 13 are sequentially formed, ion implantation processes are sequentially performed to form the LDD area, the NSD areas and the photodiode area 14. However, the photodiode surface of the unit pixel may be damaged by several processes of forming and removing photoresist and the etching process for removing the oxide film. This could lead to a leakage source.

As described above, dislocation(s) of the silicon lattice in the semiconductor substrate 11 may be caused when surface characteristics of the photodiode PD 14 deteriorate. Moreover, the dislocated portion of the silicon lattice structure may serve as an electron trap that may capture electrons. The electrons captured in the electron trap affect image display through the transfer transistor Tx. As a result, characteristics of the CMOS image sensor may deteriorate.

SUMMARY OF THE INVENTION

Accordingly, the present invention is directed to a CMOS image sensor and a method for fabricating the same that substantially obviates one or more problems due to limitations and disadvantages of the related art.

An object of the present invention is to provide an image sensor and method of fabrication that improves surface characteristics of a photodiode, e.g., by reconditioning the surface and reducing surface leakage (e.g., of or through the photodiode) that may be caused by various fabrication process steps.

Another object of the present invention is to provide a CMOS image sensor and a method for fabricating the same, which improve characteristics of the image sensor.

Additional advantages, objects, and features of the invention will be set forth at least in part in the description that follows, and in part will become apparent to those having ordinary skill in the art upon examination of the following description, or may be learned from practice of the invention. The objectives and other advantages of the invention may be realized and attained from the structure(s) particularly pointed out in the written description and claims hereof as well as from the appended drawings.

To achieve these objects and other advantages and in accordance with the purpose(s) of the invention, as embodied and broadly described herein, a method for fabricating a CMOS image sensor includes the steps of forming a photodiode area and a plurality of transistors, implanting a predetermined ion into a surface of the photodiode area (which may change the lattice structure on the semiconductor substrate surface), and forming a surface oxide film on the surface where the lattice structure may have been changed by performing an oxidation process. The surface oxide film formed on the photodiode area may have a certain curvature.

The surface oxide film is generally not removed during following processes, and therefore, may be permanent.

The step of implanting a predetermined ion into the surface of the photodiode area may be performed after removing a barrier oxide film used during ion implantation for forming the photodiode area and the transistors.

The step of implanting a predetermined ion into the surface of the photodiode area also may be performed after depositing and patterning a photoresist to expose the photodiode area only.

The predetermined ion may comprise any one of the fourth group elements (i.e., Group IVA elements from the Periodic Table of the Elements).

The step of implanting a predetermined ion into the surface of the photodiode area may be performed at an ion implantation energy of 10 KeV to 20 KeV.

Therefore, in the present invention, it is possible to recover or repair the surface of the photodiode damaged during previous fabrication processes and/or improve characteristics of the image sensor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In some embodiments, a CMOS image sensor according to the present invention includes one or more unit pixels, each comprising four transistors and a photodiode. In other embodiments, a CMOS image sensor may comprise three transistors and a photodiode.

A method for fabricating a CMOS image sensor according to embodiments of the present invention will be described with reference to FIG. 3A to FIG. 3D. Because the following embodiment, described with reference to FIGS. 3A-3D, shares common elements with the related art described with reference to FIGS. 1 and 2A-2C, certain aspects of the detailed description of the common elements may be found in above discussion of FIGS. 1 and 2A-2C.

Figure 1:
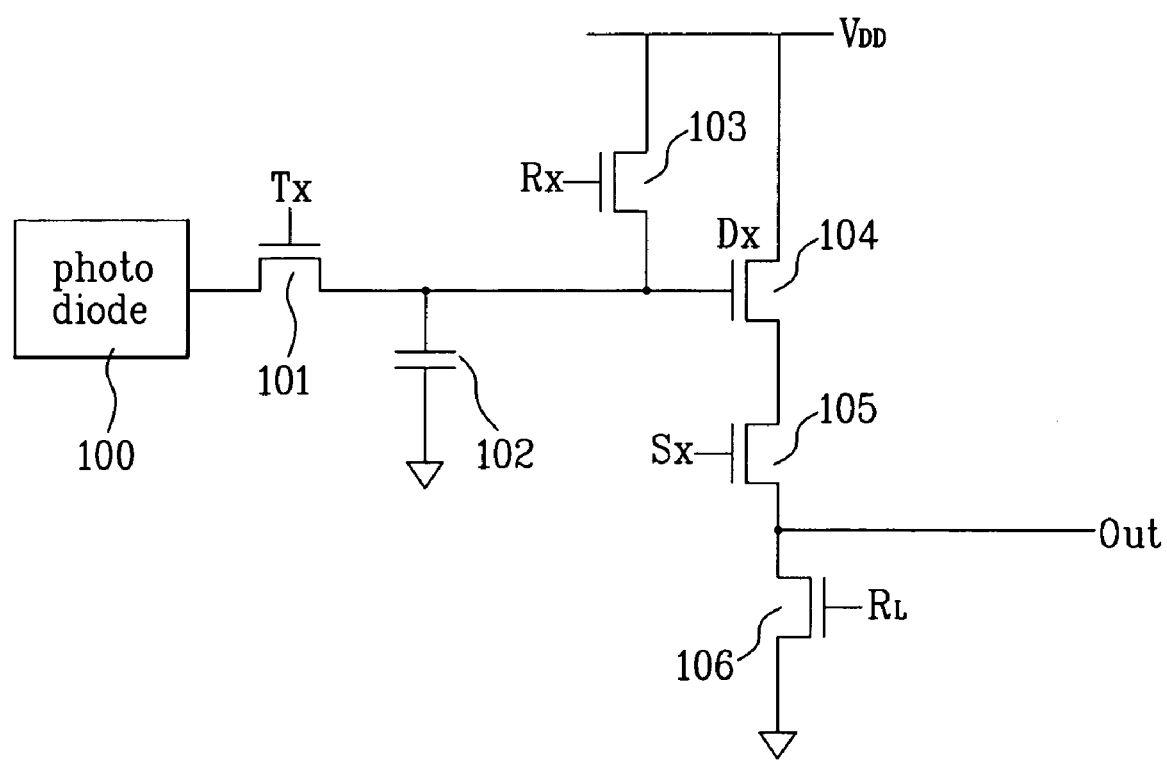
FIG. 1 is a circuit diagram illustrating a unit pixel of a related art CMOS image sensor consisting of four transistors and a photodiode.
Figure 2A:
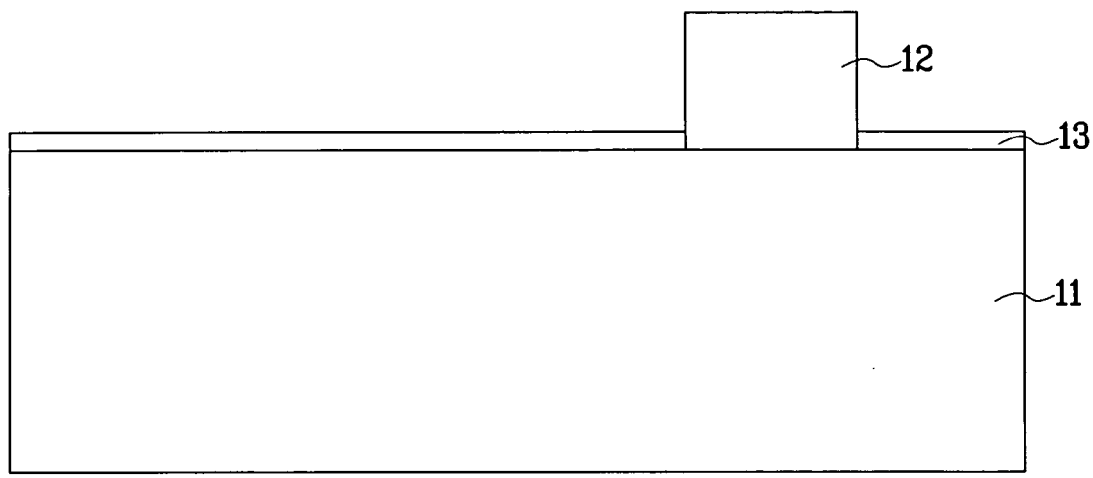
FIG. 2A to FIG. 2C are sectional views illustrating related art process steps of fabricating a related art CMOS image sensor.
Figure 2B:
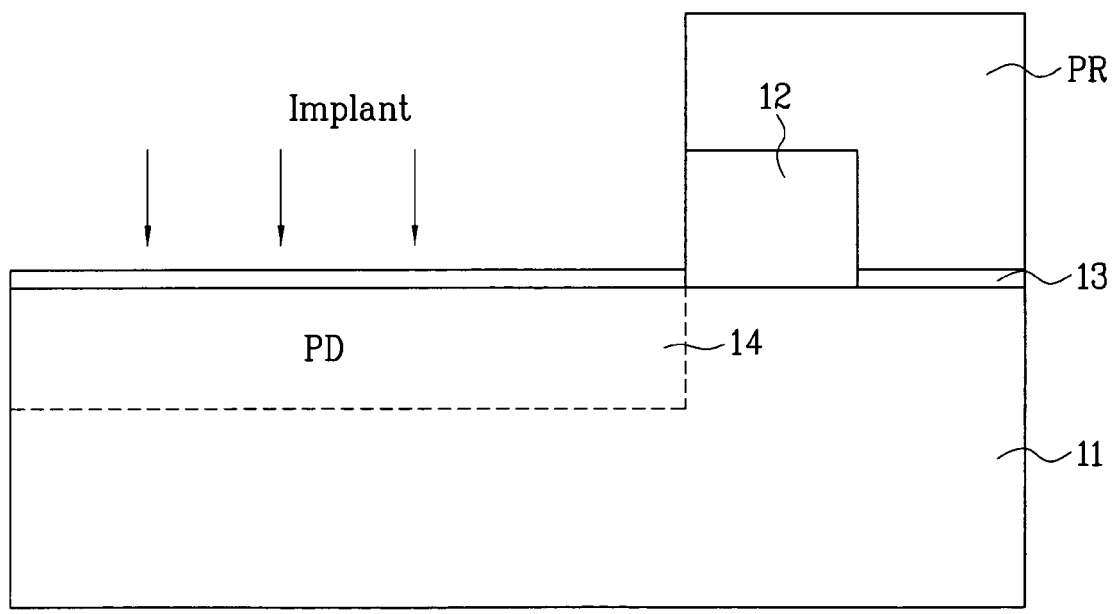
Figure 2C:
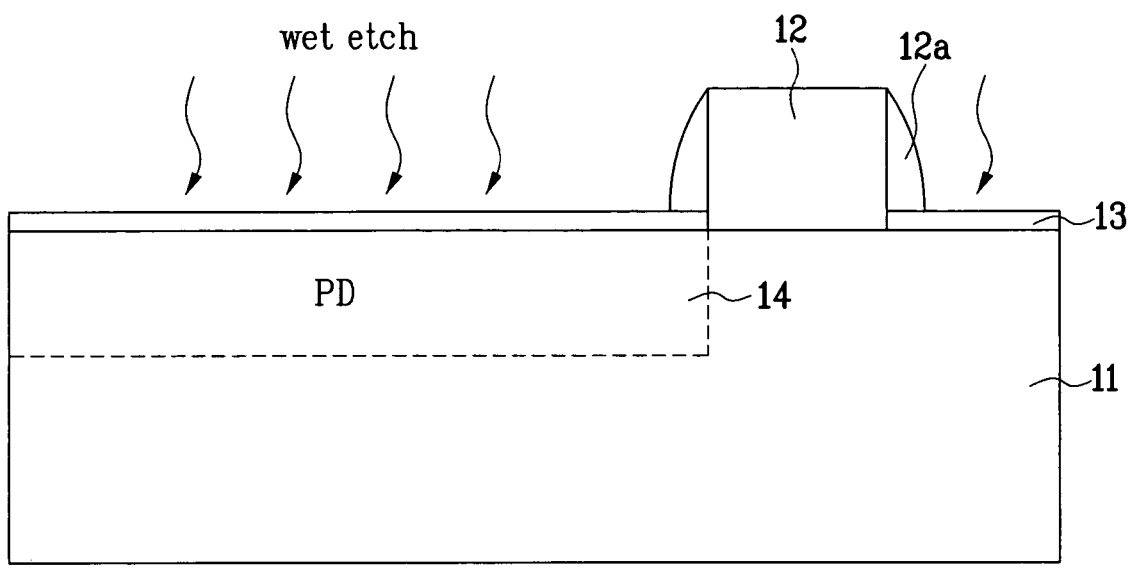
Figure 3A:
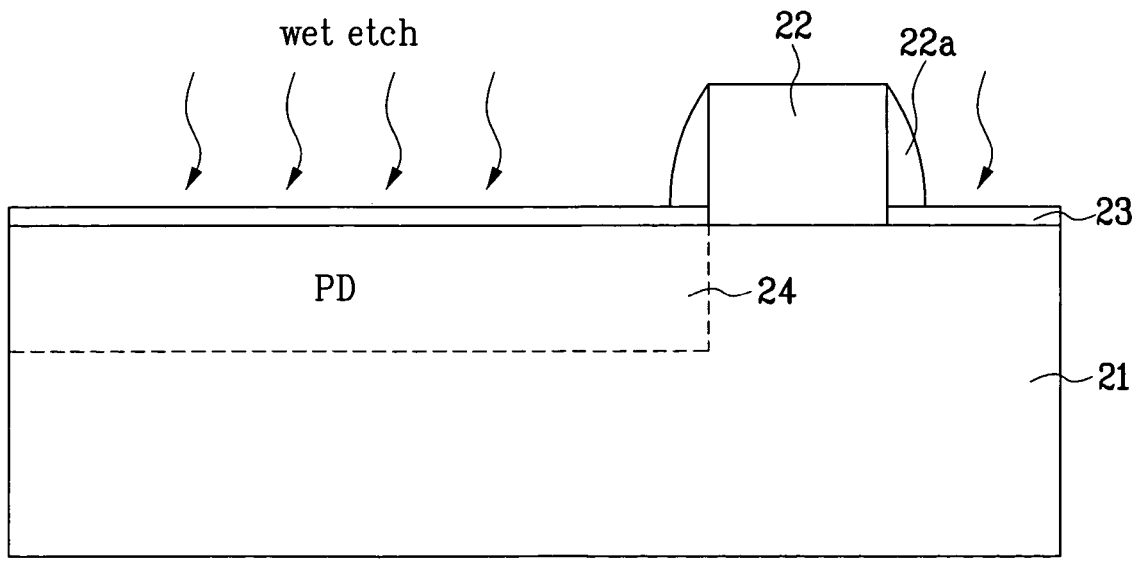
FIG. 3A to FIG. 3D are sectional views illustrating a CMOS image sensor and a fabrication process according to embodiments of the present invention.
Figure 3B:
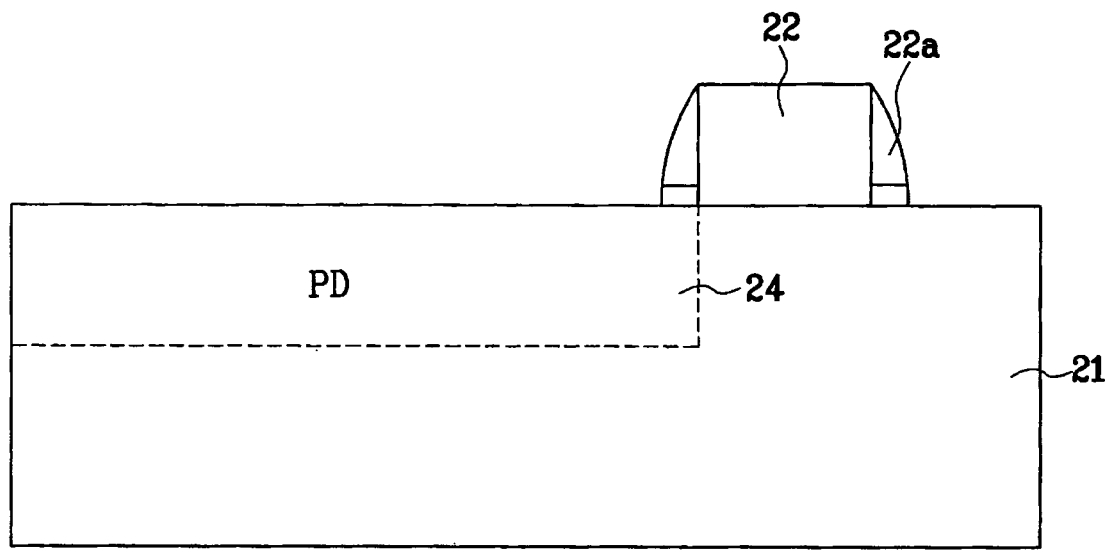
Figure 3C:
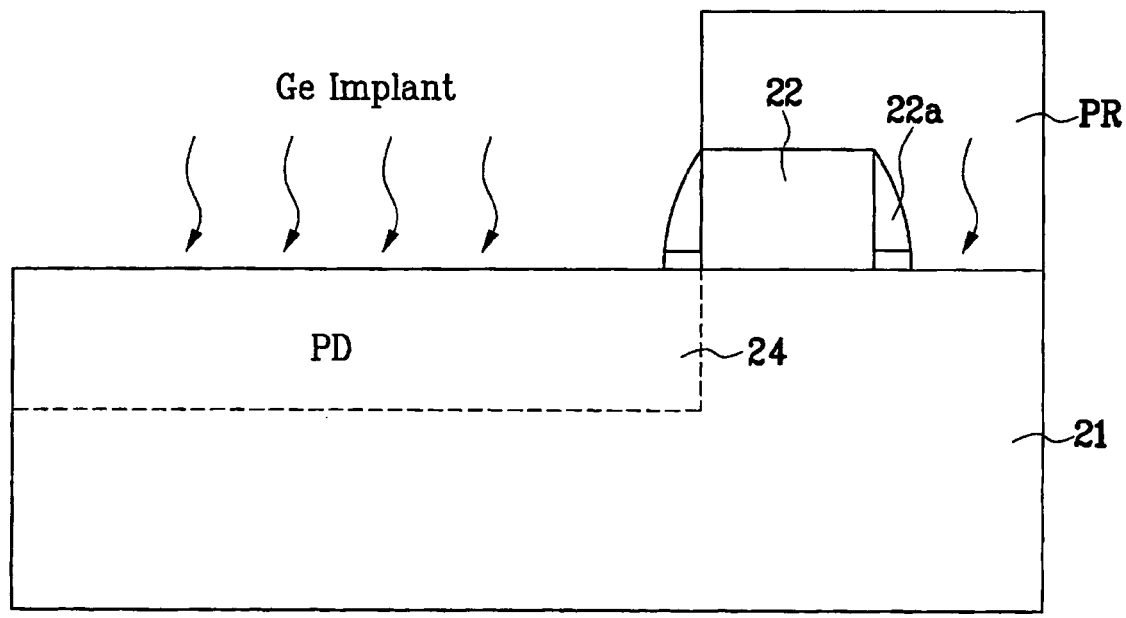
Figure 3D:
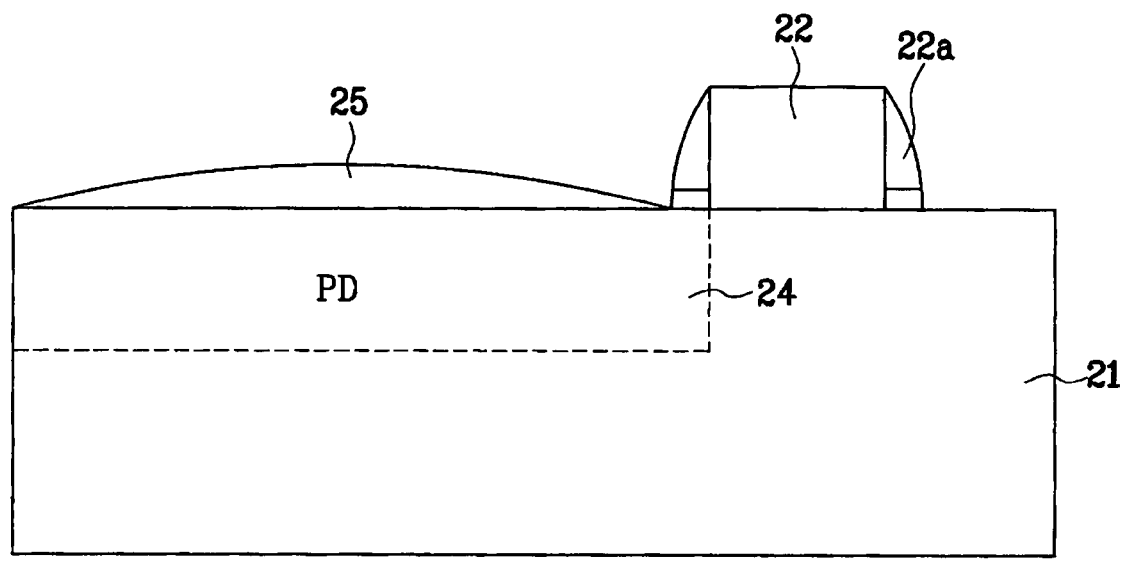
Figure 4:
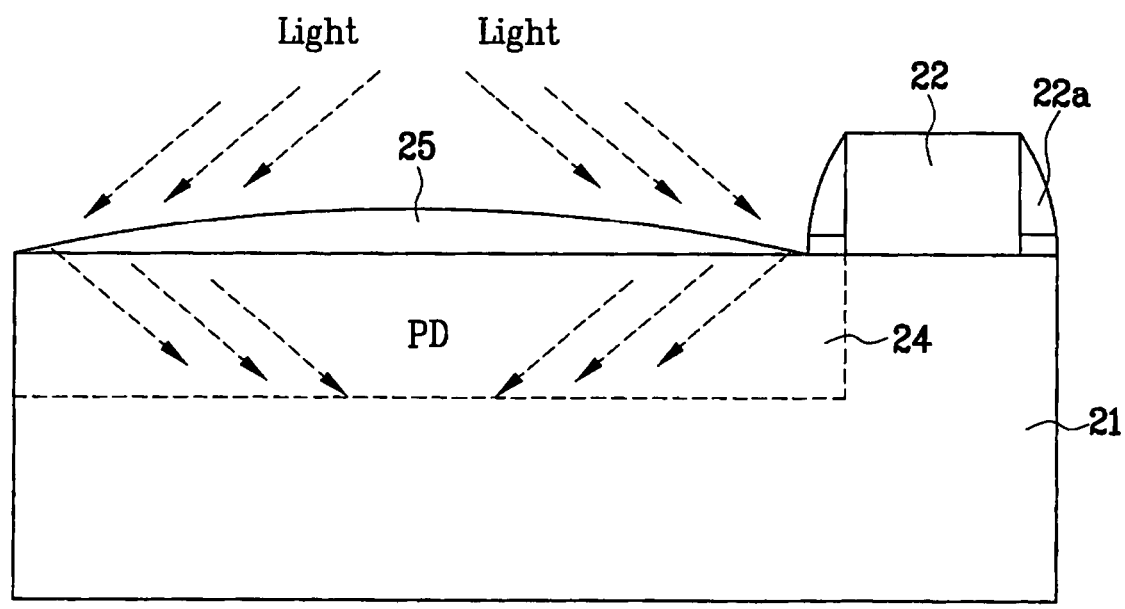
FIG. 4 is a sectional view illustrating a CMOS image sensor having a surface oxide film formed on a photodiode area in accordance with exemplary process steps of the present invention.

FIG. 3A to FIG. 3D are sectional views illustrating process steps of fabricating a CMOS image sensor according to the present invention. Referring to FIG. 3D and FIG. 4, the CMOS image sensor is shown based on a photodiode area PD and a transfer transistor adjacent to the photodiode area.

Referring to FIG. 3A, a gate electrode 22 of a transistor is formed on a semiconductor substrate 21. A barrier oxide film 23 is then formed. The series of processes for forming an LDD area, NSD areas, a photodiode area 24, and a spacer 22a of the gate electrode 22 may be carried out by known processes, including those previously described herein.

After the photodiode area 24 and the spacer 22a of the gate electrode 22 are formed, as shown in FIG. 3B, the barrier oxide film 23 is removed from the substrate 21 by an etching process.

Subsequently, a photoresist PR is deposited on the entire surface of the semiconductor substrate 21 including the gate electrode 22. Then, as shown in FIG. 3C, the photoresist PR is patterned to expose the photodiode area 24. In other words, areas except for the photodiode area 24 are masked by the photoresist PR.

Thereafter, in some embodiments, germanium (Ge) is implanted into the photodiode area 24 using the patterned photoresist as an ion implantation mask. Any one of the fourth group elements in the Periodic Table of the Elements, such as silicon, may be used instead of Ge. Preferably, however, carbon is not included in the fourth group elements to be used in this ion implantation step.

In some embodiments, Ge (or other fourth group element such as silicon) is implanted into the photodiode area 24 at a weak energy of 10 keV to 20 keV, so that the semiconductor substrate 21, or more precisely the lattice structure of the silicon surface, can be decomposed or dislocated. Thus, the Group IVA element implanted into the photodiode area PD may be referred to herein as a "lattice dislocation" ion, and the implantation thereof may be referred to herein as a "lattice dislocation" implantation. Most preferably, the energy for the lattice dislocation ion implantation is in the range of 15 keV.

Afterwards, as shown in FIG. 3D, the photoresist PR for Ge ion implantation is removed. In some embodiments, an oxidation process is performed so that a surface oxide film 25 is formed on the silicon surface of the photodiode area 24 where the lattice structure is decomposed.

Oxide film 25 is generally formed by conventional wet or dry thermal oxidation. However, it may be formed, for example, by blanket deposition, e.g., CVD, such as PE-CVD or HDP-CVD, from silicon sources such as TEOS or silane ($SiH_4$), and oxygen sources such as ozone ($O_3$) or oxygen ($O_2$), as is known in the art, as long as it is subsequently annealed sufficiently to repair some or all of the dislocations resulting from the lattice dislocation implantation step.

In some embodiments, surface oxide film 25 is thickly formed on the silicon surface of the photodiode area 24. In other embodiments, the surface oxide film 25 may have a non-uniform thickness. In some embodiments, the surface oxide film 25 formed on the photodiode area 24 may have a certain curvature as a result of the oxidation process (e.g., a convex upper surface), and the curved oxide film 25 may subsequently act as a lens.

If the oxidation process is performed after changing the silicon lattice structure corresponding to the photodiode area 24 through Ge implantation, the surface oxide film 25 is formed on the silicon surface of the photodiode area 24. The surface oxide film 25 serves to recover and/or repair the surface of the photodiode PD damaged during preceding process steps, and may help to reduce or minimize surface leakage of the photodiode PD during following process steps.

Furthermore, subsequent process steps can be performed without removing the surface oxide film 25 formed on the photodiode area 24, so that the surface oxide film 25 serves as a lens when the device is driven or operated after the product is completely fabricated. This reduces loss of external incident light and increases the amount of incident light reaching the photodiode, thereby improving image display characteristics of the image sensor.

FIG. 4 illustrates that the surface oxide film 25 formed on the silicon surface of the photodiode PD converges external incident light onto the photodiode.

As described above, the image sensor and method for fabricating a CMOS image sensor according to the present invention provides several advantages, some or all of which may be realized in each of the many embodiments encompassed by the inventions.

First, in some embodiments, formation of the surface oxide film makes it possible to recover or repair the silicon surface of the photodiode damaged during various fabrication processes and reduce or minimize surface leakage of the photodiode during subsequent processing and/or operation.

In addition, in some embodiments, it is possible to improve characteristics of the image sensor by increasing incident light on the photodiode.

It will be apparent to those skilled in the art that various modifications and variations can be made in the present invention without departing from the spirit or scope of the inventions. Thus, it is intended that the present invention covers the modifications and variations of this invention, provided they come within the scope of the appended claims and their equivalents.

What is claimed is:

1. A method for fabricating a CMOS image sensor comprising the steps of:
    forming a photodiode area and a plurality of transistors in and/or on a semiconductor substrate;
    implanting a predetermined ion comprising a Group IVA element into a surface of the photodiode area; and
    forming a surface oxide film on the surface of the photodiode area by oxidation.

2. The method according to claim 1, wherein the surface oxide film on the photodiode area has a curvature.

3. The method according to claim 1, wherein the surface oxide film is permanent.

4. The method according to claim 1, further comprising, before the step of implanting a predetermined ion into the surface of the photodiode area, removing a barrier oxide film used during the step of forming the photodiode area and the transistors.

5. The method according to claim 1, further comprising, before the step of implanting the predetermined ion into the surface of the photodiode area, depositing and patterning a photoresist to expose the photodiode area only.

6. The method according to claim 1, wherein the predetermined ion comprises germanium.

7. The method according to claim 1, wherein the step of implanting the predetermined ion into the surface of the photodiode area is performed at an ion implantation energy of 10KeV to 20KeV.

8. The method according to claim 1, wherein said photodiode area comprises a P-N junction.

9. The method according to claim 1, wherein said Group IVA element comprises silicon.

10. The method according to claim 1, wherein gates of said plurality of transistors are formed before said photodiode area.

11. A method for fabricating a CMOS image sensor comprising the steps of:
    forming a photodiode area on or in a surface of a semiconductor substrate;
    implanting a lattice dislocation ion comprising a Group IVA element into the photodiode area; and
    forming an oxide film on the photodiode area under conditions sufficient to repair dislocations resulting from the implanting step.

12. The method of claim 11, wherein forming the oxide film comprises thermally oxidizing a surface of the photodiode area.

13. The method of claim 11, wherein the oxide film has a non-uniform thickness.

14. The method of claim 13, wherein the oxide film has a convex surface.

15. The method of claim 13, wherein the oxide film focuses incident light on the photodiode.

16. The method of claim 11, wherein the semiconductor substrate has a barrier film thereon during the photodiode forming step, and the method further comprises removing the barrier film before the step of implanting the lattice dislocation ion.

17. The method of claim 11, wherein the lattice dislocation ion is implanted at an energy of 10KeV to 20KeV.

18. The method according to claim 11, wherein said Group IVA element comprises germanium.

19. The method according to claim 11, wherein said photodiode area comprises a P-N junction.

20. The method according to claim 11, wherein said Group IVA element comprises silicon.

21. The method according to claim 11, wherein gates of said plurality of transistors are formed before said photodiode area.

* * * * *